United States Patent
Dietrich et al.

(10) Patent No.: US 7,120,818 B2
(45) Date of Patent: Oct. 10, 2006

(54) METHOD AND DEVICE FOR DATA TRANSFER

(75) Inventors: Stefan Dietrich, Türkenfeld (DE); Peter Schrögmeier, München (DE); Sabine Kieser, Hausham (DE); Christian Weis, Germering (DE)

(73) Assignee: Infineon Technologies AG, Munich (DE)

( * ) Notice: Subject to any disclaimer, the term of this patent is extended or adjusted under 35 U.S.C. 154(b) by 531 days.

(21) Appl. No.: 10/103,517

(22) Filed: Mar. 22, 2002

(65) Prior Publication Data

US 2002/0136243 A1   Sep. 26, 2002

(30) Foreign Application Priority Data

Mar. 22, 2001   (DE) ................ 101 14 159

(51) Int. Cl.
G06F 1/04   (2006.01)
(52) U.S. Cl. .............. 713/600; 713/400; 711/100; 370/535
(58) Field of Classification Search ........ 713/400, 713/600; 711/100, 104; 326/62, 68, 93, 326/95, 99
See application file for complete search history.

(56) References Cited

U.S. PATENT DOCUMENTS

| 4,477,896 | A |   | 10/1984 | Aker |
| 5,095,230 | A |   | 3/1992 | Takai et al. |
| 5,134,583 | A | * | 7/1992 | Matsuo et al. ............ 365/200 |
| 5,907,656 | A | * | 5/1999 | Oguro ....................... 386/94 |
| 5,999,022 | A |   | 12/1999 | Iwata et al. |
| 6,195,397 | B1 |   | 2/2001 | Kwon |
| 6,201,760 | B1 |   | 3/2001 | Yun et al. |
| 6,297,620 | B1 | * | 10/2001 | Goodrich, II ............ 320/152 |
| 6,819,305 | B1 | * | 11/2004 | Wicker ..................... 345/3.1 |
| 6,831,952 | B1 | * | 12/2004 | Symes et al. ............ 375/259 |

FOREIGN PATENT DOCUMENTS

| JP | 04-032093 | 2/1992 |
| JP | 09-008862 | 1/1997 |
| JP | 11-154859 | 6/1999 |
| JP | 2000-195259 | 7/2000 |
| JP | 2001-118377 | 4/2001 |

* cited by examiner

*Primary Examiner*—Thuan Du
(74) *Attorney, Agent, or Firm*—Laurence A. Greenberg; Werner H. Stemer; Ralph E. Locher

(57) ABSTRACT

Data transfer is effected on an internal and/or on an external transfer path with or in a semiconductor component, such as a semiconductor memory. A first multiplexer/demultiplexer codes a data sequence by defining a current level and a voltage level for a data signal. The coded sequence is then transferred on the transfer path synchronously with a clock signal and is decoded in a second multiplexer/demultiplexer by evaluation of the received current level and of the received voltage level. From this, the transferred data sequence is determined.

16 Claims, 4 Drawing Sheets

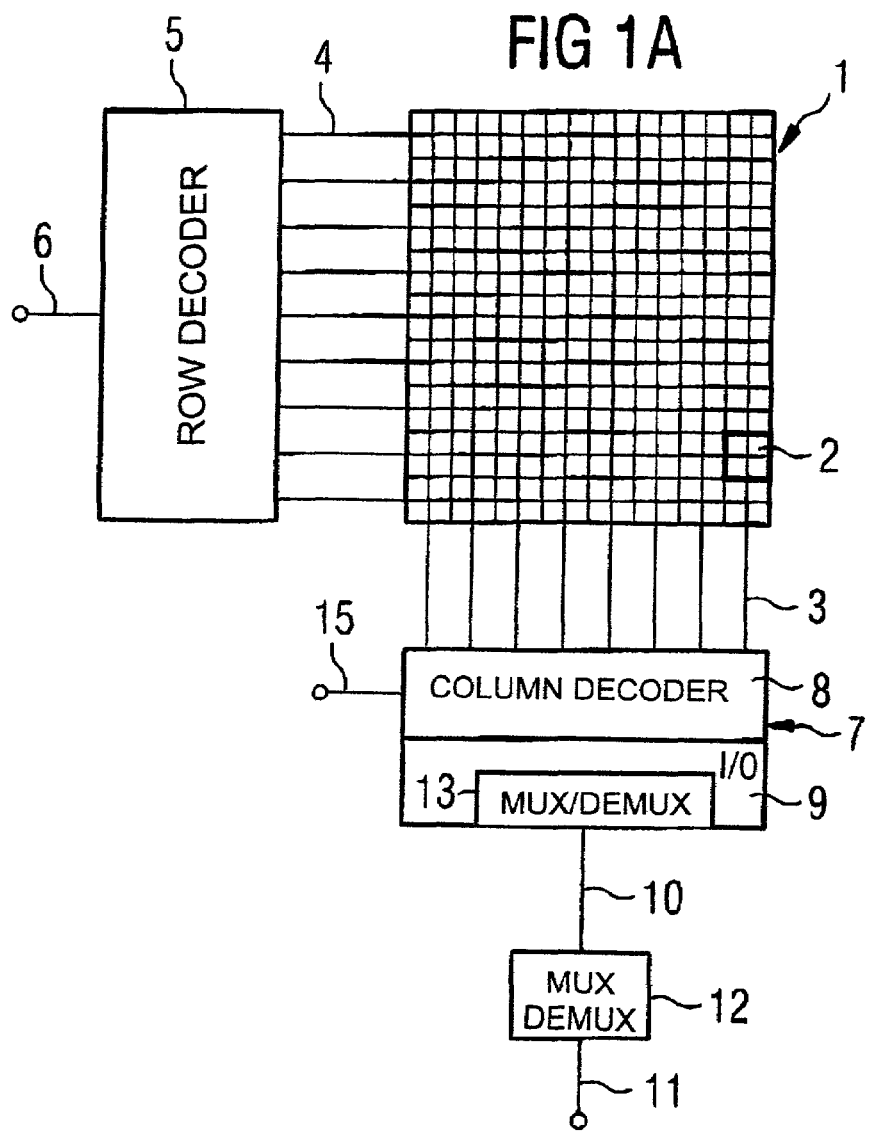

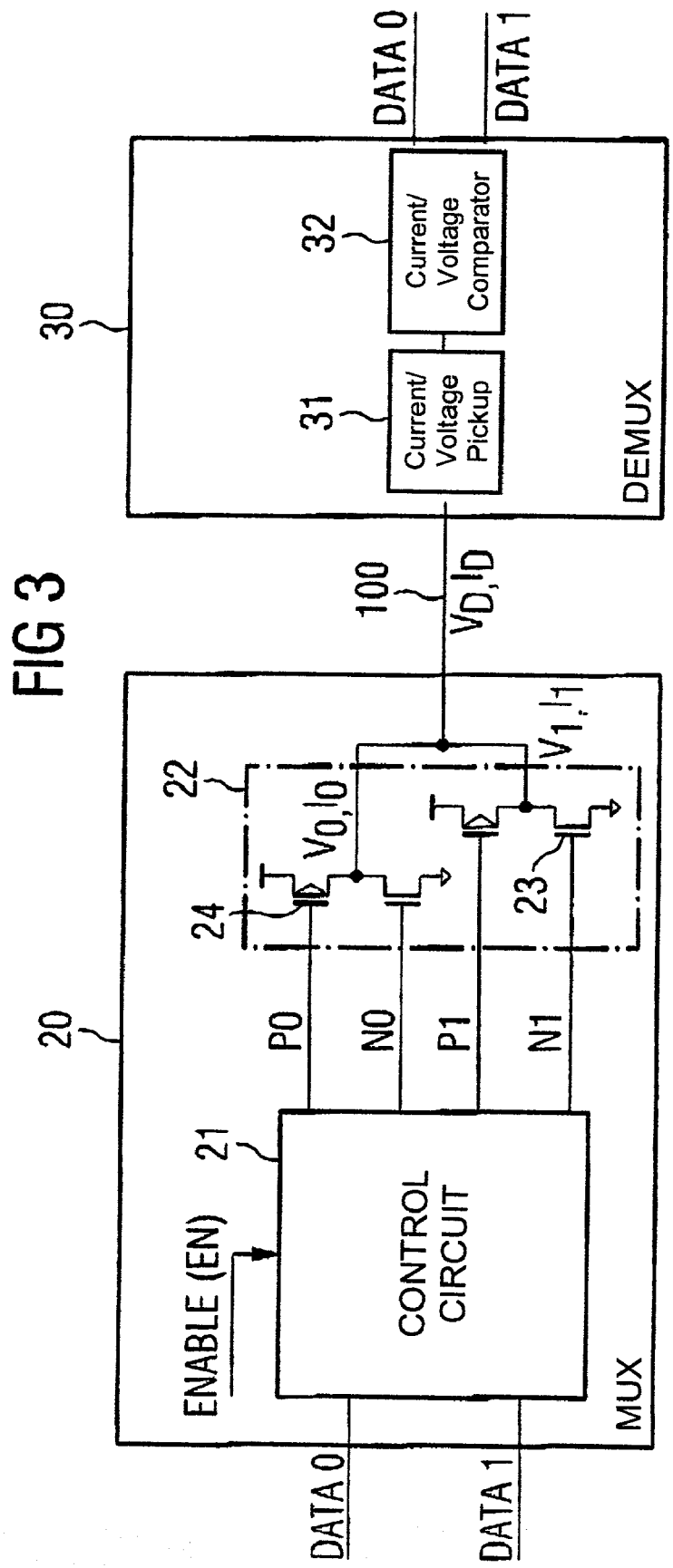

FIG 4

| Inputs | | | Outputs | | | | Level | |
|---|---|---|---|---|---|---|---|---|
| EN | DATA 0 | DATA 1 | P0 | N0 | P1 | N1 | $V_D$ | $I_D$ |
| 1 | 0 | 0 | 1 | 1 | 1 | 1 | $V_0$ | 2I |
| 1 | 0 | 1 | 1 | 1 | 1 | 0 | $V_0$ | I |
| 1 | 1 | 0 | 0 | 0 | 1 | 0 | $V_1$ | I |
| 1 | 1 | 1 | 0 | 0 | 0 | 0 | $V_1$ | 2I |
| 0 | X | X | 1 | 0 | 1 | 0 | X | X |

METHOD AND DEVICE FOR DATA TRANSFER

BACKGROUND OF THE INVENTION

Field of the Invention

The invention relates to a method for data transfer on an internal and/or external transfer path in and/or to a semiconductor component, in particular a semiconductor memory, and a corresponding data transfer device.

The rapid progress in semiconductor technology has made it possible to develop processors with clock rates in the gigahertz range. In order to be able to utilize such processors effectively, it is necessary that the semiconductor memories which contain the data for the processors also operate with similarly high processing speeds, and that large data transfer bandwidths are available for transferring the data between the processors and the semiconductor memory devices. Thus, for example in state of the art graphics cards, the performance-limiting element is deemed to be the predetermined transfer bandwidth between the processor used as controller on the graphics card and the semiconductor memory used as image data memory.

Random access memories (RAMs), wherein data can be read in and out as often as desired, are primarily used as semiconductor memories for data exchange with processors or controllers. Random access memories are designed either as static memories (SRAMs), wherein the written data can be stored for as long as desired with the operating voltage present, or as dynamic memories (DRAMs), wherein the data in the memory cells have to be refreshed at cyclic intervals. However, DRAMs have distinct advantages over SRAMs in the integration of the memory cells and are therefore the preferred semiconductor memories in computers.

The data transfer between the processor or controller and the semiconductor memory and the data processing on the semiconductor memory are conventionally effected synchronously with an internally or externally predetermined system clock. It is usually the case that, per data input/output of the semiconductor memory, one bit signal is transferred synchronously within a clock cycle. The logic state of the bit signal is defined as voltage level. Thus, in the case of a predetermined maximum voltage level of, say, 3.3 volts, a 0 volt signal applied on a rising clock edge of the system clock means a logic "zero" and a 3.3 volt signal means a logic "one". In order to be able to reliably evaluate the transferred signal level, the predetermined level range is conventionally quantified in two stages and in each case interpreted as bit signal. By way of example, a signal level range from 0 volts to 1.65 volts defines the signal level for a logic "zero" and a signal level range from 1.66 volts to 3.3 volts defines the signal level for a logic "one".

In order to further increase the data transfer rate in such synchronously operating semiconductor memories, the company RAMBUS has developed a transfer method wherein the semiconductor memories can be operated with a doubled transfer rate (DDR). In that method, per clock cycle, a bit signal is in each case transferred both on a rising and on a falling clock edge of the system clock. The bit signal is evaluated by the semiconductor memory.

On account of requirements of continually increasing stringency imposed on the data transfer bandwidth between the processors or controllers and the semiconductor memories, it is necessary, however, to further increase the data transfer rate to or in the semiconductor memories themselves, in particular also in the case of synchronously operating DRAMs. One possibility consists in increasing the system clock rate for the data transfer, but limitations for a maximum possible clock rate are prescribed by high-frequency effects. A further possibility is to increase the number of parallel data inputs/outputs of the semiconductor memory. In this case, however, there are production limitations on account of the predetermined chip size.

U.S. Pat. No. 5,095,230 discloses a method for data transfer in conjunction with a data output circuit of a semiconductor component, wherein a data sequence is coded by establishing a voltage level for a data signal, the data signal is then transferred and the data signal is subsequently decoded by evaluating the voltage level in order to determine the transferred data sequence. U.S. Pat. No. 4,477,896 discloses a further data transfer method and a corresponding device, wherein data are transferred as current pulses in one direction and as voltage pulses in the other direction, on the same line.

SUMMARY OF THE INVENTION

It is accordingly an object of the invention to provide a method and a device for data transfer, which overcomes the above-mentioned disadvantages of the heretofore-known devices and methods of this general type and which allow data transfer on a transfer path to or in a semiconductor memory which can be used to increase the data transfer bandwidth in a simple and reliable manner.

With the foregoing and other objects in view there is provided, in accordance with the invention, a data transfer method, that is, a method for data transfer on an internal and/or external transfer path in and/or to a semiconductor component, in particular a semiconductor memory. The method comprises the following steps:

coding a data sequence by defining a current level and a voltage level for a data signal;

transferring the data signal; and decoding the data signal by evaluating the current level and the voltage level and determining therefrom the data sequence transferred in the data signal.

In accordance with an added feature of the invention, a voltage-related bit sequence is provided as the data sequence to be transferred.

In accordance with an additional feature of the invention, a clock signal is provided, and the data signal is transferred in synchronicity with the clock signal. Preferably, the data signal is transferred synchronously with the rising or the falling clock edge of the clock signal.

In accordance with another feature of the invention, the current level is multiplexed from at least two current intensities and the voltage level is multiplexed from at least two voltage levels.

With the above and other objects in view there is also provided, in accordance with the invention, a data transfer device, comprising:

a first multiplexer/demultiplexer for coding a data sequence by defining a current level and a voltage level for a data signal;

a transfer path for transferring the data signal connected to the first multiplexer/demultiplexer; and a second multiplexer/demultiplexer connected to the transfer path for receiving the data signal, the second multiplexer/demultiplexer decoding the data signal by evaluating the received current level and the received voltage level to determine the transferred data sequence.

According to the invention, a data sequence is coded by defining a current level and a voltage level for a data signal, the data signal is then transferred via the transfer path and the data signal is subsequently decoded again by evaluating the current level and the voltage level in order to determine the transferred data sequence. The signal coding according to the invention means that it is possible to use, in addition to the voltage level, also the current level for signal coding and thus for transferring bit signals. As a result, the data transfer rate can be significantly increased. By using both the current level and the voltage level for data multiplexing, it is possible, in comparison with the multiplexing which usually uses solely the voltage level, still to provide for a sufficient signal distance between the individual levels in conjunction with a high multiplex factor, so that even in the case of a signal attenuation and a signal noise influenced by the level background, a clean signal resolution is ensured during reception. The signal coding according to the invention means that, in particular, a voltage-related bit sequence can also be converted into a multiple multiplexing in a simple manner.

In accordance with a preferred embodiment, a reference signal with a predetermined current level and a predetermined voltage level is furthermore transferred in order to compare the current level of the transferred data signal with the current level of the reference signal and the voltage level of the transferred data signal with the voltage level of the reference signal. The additional transfer of a reference signal means that it is possible to carry out a multiple-level multiplexing wherein only a small signal distance is required between the individual levels since, on account of the signal level referencing that is carried out independently of the maximum level and level background, a clean level resolution is ensured even in the case of a small level distance.

According to the invention, the multiplexer for coding a data sequence by defining a current level and a voltage level for a data signal is a circuit having at least two separately switchable CMOS inverters with the same driver strength in order to multiplex the current level from at least two current intensities and the voltage level from at least two voltage levels. This simple circuit makes it possible, in particular, to convert a voltage-related bit sequence into a multiplexed data signal with a current level and voltage level in a simple manner.

According to the invention, it is furthermore preferred that the demultiplexer for decoding the data signal by evaluating the received current level has a voltage pickup, a current pickup, a voltage comparator and a current comparator, the voltage measured by the voltage pickup being evaluated in the voltage comparator and the current intensity measured by the current pickup being evaluated in the current comparator. This simple demultiplexer circuit ensures that, in a reliable manner, a data signal multiplexed from a current level and voltage level is translated back into a voltage-related bit sequence. other features which are considered as characteristic for the invention are set forth in the appended claims.

Although the invention is illustrated and described herein as embodied in a method and device for data transfer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a schematic block diagram of a basic construction of a RAM with an internal data transfer according to the invention;

FIG. 2 is a table illustrating a data transfer method according to the invention with single-level multiplexing;

FIG. 3 is a schematic block circuit diagram of a data transfer device according to the invention; and FIG. 4 is a data coding table according to the invention with the multiplexer of the data transfer device of FIG. 3.

DESCRIPTION OF THE PREFERRED EMBODIMENTS

Figure 1B:
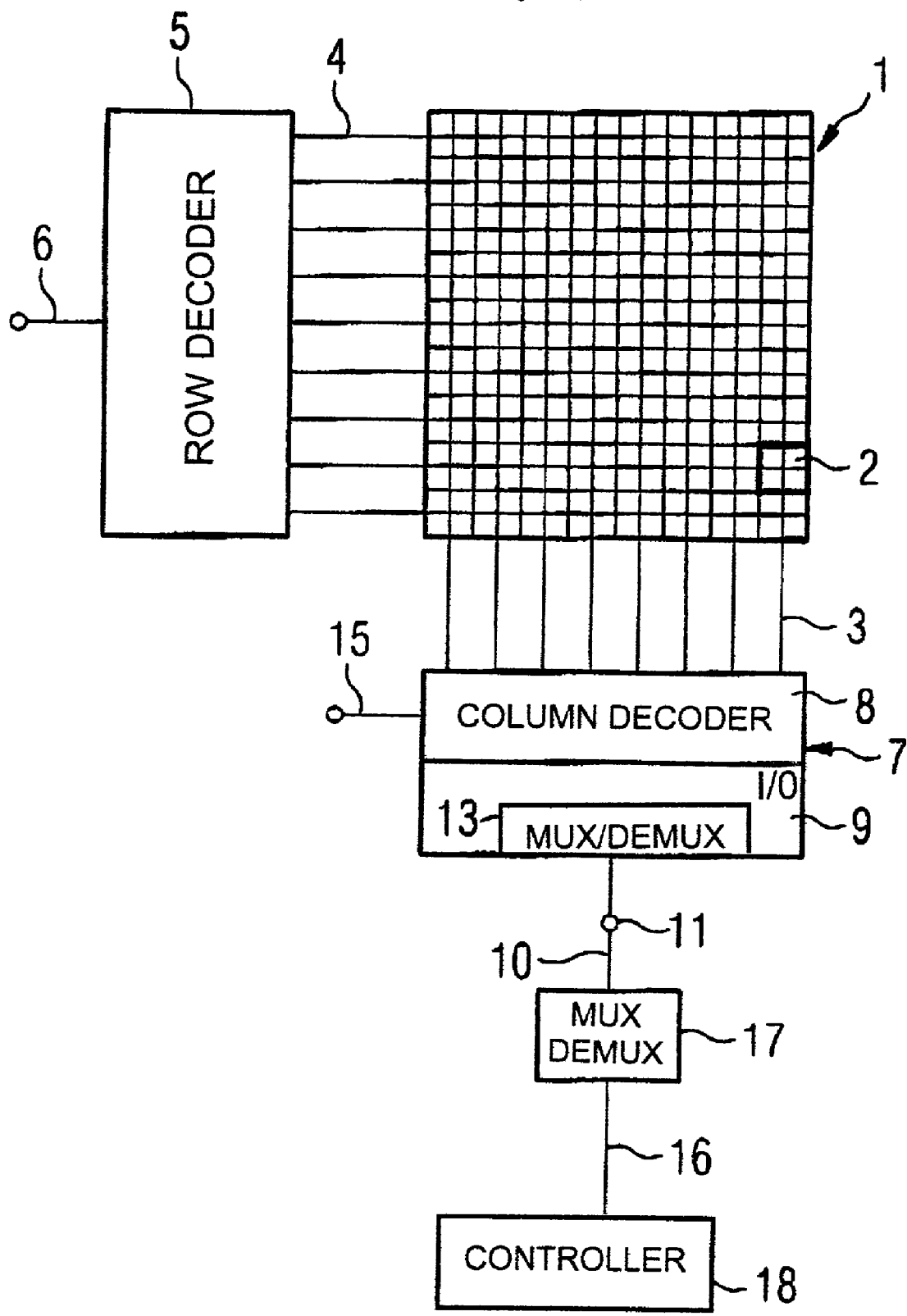
FIG. 1B is a schematic block diagram of a basic construction of a RAM with an external data transfer according to the invention.

Referring now to the figures of the drawing in detail and first, particularly, to FIG. 1A thereof, there is shown the basic configuration of a random access memory (RAM) constructed as a matrix memory. The memory matrix is thereby composed of a multiplicity of memory cells 2 situated at the points of intersection of XY address lines, the so-called bit lines 3 and word lines 4. Data can be stored bit by bit in the memory cells 2. The word lines 4 are connected to a row decoder 5. The row decoder 5 decodes the row addresses applied via a row address line 6. The bit lines 3 are connected to a control unit 7, which has a column decoder 8 which decodes the column addresses applied via a memory address line 15.

The control unit 8 furthermore has an input/output circuit 9 with write and read amplifier, which serves for realizing a desired function in a memory cell 2 selected via the row or column address, i.e. for writing to the memory cell 2 or for reading from the memory cell 2. The input/output circuit 9 is connected via a bidirectional data transfer line 10 to the data inputs/outputs 11 of the semiconductor memory, only one data input/output with one transfer path being shown by way of example in FIG. 1A. In addition to the terminals on the control unit 8 which are shown in FIG. 1A, even further terminals for inputting control data are provided, depending on the design of the RAM.

In order to enable a fast internal data transfer from the data input/output 11 to the input/output circuit 9, a first multiplexer/demultiplexer 12 is provided at the data input/output 11 and a second multiplexer/demultiplexer 13 is provided at the end of the internal transfer path 10 in the input/output circuit 9. The first and the second multiplexer/demultiplexer 12, 13 serve for carrying out, on the internal data transfer path 10, a signal level multiplexing with which a high data transfer rate is achieved on the transfer path 10 in the RAM. In this case, the signal level multiplexing according to the invention is carried out in such a way that, at the transmitting end, a data sequence comprising a predetermined number of voltage-related bits are converted into a predetermined current level and a predetermined voltage level and a data signal with this multiplexed current level and this multiplexed voltage level is then transferred. At the receiving end, the current level and the voltage level of the transferred data signal are then translated back into the data sequence comprising voltage-related bits.

FIG. 2 shows a single-level multiplexing according to the invention with two different voltage levels, namely the voltage level $V_0$ and the voltage level $V_1$, and two different current levels, namely the current level $I_0$ and the current level $I_1$. With these two voltage levels and these two current levels, it is possible to transfer a two-bit information item per data signal. In this case, a transferred data signal with the voltage level $V_0$ and the current level $I_0$ corresponds to a logic bit sequence "00". The logic bit sequence "01" is transferred with the voltage level $V_0$ and the current level $I_1$ for the data signal. The voltage level $V_1$ and the current level $I_0$ for the data signal correspond to a bit sequence "10" and the voltage level $V_1$ and the current level $I_1$ to a bit sequence "11". Generally, in the case of a signal level multiplexing by combining N+1 voltage levels and N+1 current levels, there results the possibility of combining (N+N) binary information items in a current—and voltage—multiplexed data signal.

According to the invention, it is particularly advantageous to carry out a combined current level/voltage level multiplexing. Compared with the conventionally implemented multiplexing that uses exclusively the voltage level, this makes it possible to achieve an enlarged transfer bandwidth and moreover also to ensure that only a limited number of levels have to be used, so that a sufficient signal separating distance is always produced between the individual levels. In order, however, to be able to reliably carry out a signal-interference-independent signal level resolution both of the voltage level and of the current level, it is possible to transfer in addition to a data signal with a multiplexed current level and a multiplexed voltage level a reference signal with a reference current level and a reference voltage level, which are then used as comparison levels for resolving the multiplexed current level and the multiplexed voltage level of the transferred data signal.

However, the explained data transfer method according to the invention with multiplexed current and voltage levels can be used not only on an internal transfer path in a RAM, as is shown in FIG. 1A, but also for an external data transfer between a RAM and a controller or processor. FIG. 1B shows such a second embodiment, wherein a signal level multiplexing of the current level and voltage level is performed on an external data transfer path 16 between the data input/output 11 of the RAM 1 and a controller 18. For this purpose, an external third multiplexer/demultiplexer 17 is connected upstream of the data input/output 11 of the RAM. With this construction, an external data transfer from the external controller 18 to the RAM 1 can be effected, which is performed in a similar manner to the data transfer in the RAM as illustrated in connection with FIG. 1A. Furthermore, it is also possible to carry out both the external data transfer to the RAM and the internal data transfer in the RAM with the data transfer technique according to the invention wherein both the transferred voltage level and the transferred current level are multiplexed. In this case, a combination of the embodiments shown in FIG. 1A and FIG. 1B can be used as data transfer device.

The RAMs shown in FIGS. 1A and 1B may be either a static RAM SRAM) or a dynamic RAM (DRAM). In the case of an SRAM, the data are held in the memory cells throughout the period of time during which an operating voltage is applied. In the case of a DRAM, the data in the memory cells have to be periodically refreshed. In addition to such RAMs, the data transfer method according to the invention wherein both the current level and the voltage level of the transferred data signal are multiplexed can also be used with other semiconductor components for the internal or the external data transfer.

FIG. 3 shows one possible embodiment with a multiplexer unit 20 at the transmitting end, a transfer path 100 and a demultiplexer unit 30 at the receiving end of the transfer path. In the embodiment shown, the multiplexer unit 20 serves for the level multiplexing of two current levels and two voltage levels. The multiplexer unit 20 is composed of a control circuit 21 and an inverter circuit 22 arranged downstream. At the control circuit 21, the bit sequence to be multiplexed is present on parallel data inputs DATA0, DATA1. In the embodiment shown, a two-bit data sequence is multiplexed, the first bit being present at the data input DATA0 and the second bit being present at the data input DATA1. The control circuit 21 furthermore has a control input ENABLE (EN), by means of which the control circuit is activated.

The inverter circuit 22 is composed of two essentially identical CMOS inverters 23, 24 connected in parallel. Each of the CMOS inverters 23, 24 has a series circuit comprising a P-channel field-effect transistor P0, P1 and an N-channel field-effect transistor N0, N1. In this case, all the field-effect transistors P0, N0, P1, N1 are of the junction type, the N-channel field-effect transistor being normally off, i.e. no current flow takes place in the basic state and a current flow occurs between source and drain only when a threshold voltage is present at the gate. In contrast, the P-channel field-effect transistor is normally on, i.e. a current flow takes place between source and drain if no voltage is present at the gate, whereas the P-channel transistor turns off if the gate is set at the threshold voltage.

Each of the two CMOS inverters 23, 24 is connected to the grounding potential GND by the source input of the P-channel field-effect transistor P0, P1, whereas the drain output of the N-channel transistor N0, N1 is connected to the supply potential VCC. The gate control inputs of the transistors are all connected to the control circuit 21. The output OUT1 between the P-channel transistor P0 and the N-channel transistor N0 of the first inverter 23 and the output OUT2 between the P-channel transistor P1 and the N-channel transistor N1 of the second inverter 24 are connected in parallel and are connected to the transfer path 100.

At the receiving end of the transfer path 100, the demultiplexer 30 has a combined current/voltage pickup 31, which can be used to determine the current level and the voltage level, respectively, of the transferred data signal. The pickup 31 is in turn connected to a combined current/voltage comparator 32, from which the data outputs DATA0, DATA1 proceed. Since two data items are decoded in the present case, as on the output side two data outputs are provided on the demultiplexer 30. The combined current/voltage pickup 31 and current/voltage comparator 32 illustrated in the embodiment according to FIG. 3 can also be designed as separate units. Furthermore, it is also possible to provide a reference signal pickup (not shown) if a reference signal is also transferred in addition to a data signal. Such a reference signal pickup would then be connected to the comparator 32 in the demultiplexer 30.

One possible coding operation for a two-bit data sequence with the coder 20 shown in FIG. 3 can be effected according to the scheme shown in FIG. 4. FIG. 4 shows the signals on the data inputs DATA0, DATA1 and the control input EN of the control circuit 21, the control signals resulting therefrom on the outputs of the gate control circuit 21, which are present on the control lines of the transistors P0, P1, N1 of the inverter circuit 22, and also the current and voltage levels of the inverter circuit 22 which are output onto the transfer path 100.

The data transfer in semiconductor memories is usually effected synchronously with the system clock. This means that the data signal is transferred synchronously with a clock signal which is prescribed by an external controller or processor or by the semiconductor memory itself, the transferred signal levels being evaluated on the clock edges of the system clock signal. In conventional data transfer methods in synchronous semiconductor memories, the data signal is generally transferred synchronously with the rising clock edge of the clock signal. However, in accordance with a variant used by the company RAMBUS, there is additionally the possibility of also transferring a data signal on the falling clock edge of the system clock, as a result of which it is possible to double the data transfer rate.

In the case of the embodiment shown in FIGS. 3 and 4, the synchronous data transfer is regulated via the control input EN of the control circuit 21. If no data are intended to be transferred, i.e. no data are present on the data inputs DATA0, DATA1 of the control circuit 21, a low level is present on the control input EN of the control circuit 21. The control circuit 21 is then in the basic state, a high level being present at the gate control inputs of the P-channel field-effect transistors P0, P1 and a low level being present on the gate control inputs of the N-channel field-effect transistors P0, P1. All the transistors then turn off, so that the inverter circuit 22 is switched off and no data signal is output onto the data transfer path 100.

By contrast, if bit signals are present on the data inputs DATA0, DATA1 of the control circuit 21, the control circuit 21 is set at the high level via the control line EN in order to carry out a level multiplexing. If the bit sequence "00" is present on the data inputs DATA0, DATA1, i.e. a low level is in each case prescribed, the control circuit 21 applies a high level onto the gate control lines of all the transistors of the two CMOS inverters 23. The consequence of this is that the respective N-channel transistor N0, N1 of the CMOS inverters 23, 24 turns on, whereas the P-channel transistors P0, P1 turn off. The consequence of this is that a low voltage level V0 is output on the output of the inverter circuit 21, but the two currents through the N-channel transistors N0, N1 are added to form a high current level 2I at the output. A data signal with the low voltage level V0 and the high current intensity 2I is thus transferred.

In the case where a bit sequence "01", i.e. a low and a high level, is present on the data inputs DATA0, DATA1, the gate control lines of the transistors P0, N0, P1 are switched to a high level, whereas the gate control line of the transistor N1 is switched to a low level. In this switching state, a data signal with the low voltage level V0 and a current intensity I is output onto the output of the inverter circuit 21, since only the transistor N1 of the CMOS transistor 23 turns on, whereas the other transistors turn off.

In the case of a bit sequence "10" on the data inputs DATA0 and DATA1 of the control circuit 21, the gate control lines of the transistors P0, N0, N1 in the inverter circuit 22 are held at the low level, whereas the transistor P1 is held at the high level. The consequence of this is that the transistor P0 of the CMOS inverter 23 turns on, whereas all the other transistors turn off. A data signal having a high voltage level V1 and the low current level I is thus produced at the output of the inverter circuit.

In the case where a high signal level is in each case present on the two data inputs DATA0, DATA1 of the control circuit 21, the signal level indicating a bit sequence "11", the control unit 21 outputs a respective low level onto the gate control inputs of the transistors. The consequence of this is that the two P-channel transistors P0, P1 in the CMOS inverters 23, 24 turn on, so that a data signal with the high voltage level V and the high current intensity 2I is output at the output of the inverter circuit 22.

Consequently, the multiplexer 20 according to the invention can be used, in a simple manner, to convert a voltage-related two-bit data sequence into a data signal with a multiplexed current level and a multiplexed voltage level. The circuit illustrated is distinguished by a simple construction and only little circuitry.

In the event of different current levels being used for the two CMOS inverters 23, 24, as an alternative, instead of the four information states illustrated, eight information states would already be able to be transferred, so that a three-bit data sequence could be multiplexed. It is also possible, of course, to provide additional CMOS inverter circuits as well, in order to multiplex a correspondingly larger number of data bits by refining in particular the current levels used for the transferred data signal. Furthermore it is also possible, of course, as an alternative to provide additional voltage levels in order thus also to be able to transfer an enlarged bit sequence with a data signal.

The transferred multiplexed data signal is then decoded again in the demultiplexer 30 in order to recover the original voltage-related bit data sequence. For this purpose, the voltage or current level is determined in the current/voltage pickup 31 and evaluated in the comparison device 32 in order to determine the multiplexed bit sequence, which is then output in parallel onto the data outputs DATA0, DATA1 of the demultiplexer 30.

The features of the invention disclosed in the above description, the drawings and the claims may be of importance both individually and in any desired combination for the implementation of the invention in its various configurations.

The invention claimed is:

1. A data transfer method, which comprises the following method steps:
   coding a data sequence containing at least two bits by defining a current level and a voltage level for a data signal;
   transferring the data signal; and
   decoding the data signal by evaluating the current level and the voltage level and determining therefrom the data sequence containing the at least two bits transferred in the data signal.

2. The method according to claim 1, wherein the transferring step comprises transferring the data internally on an internal transfer path of a semiconductor component.

3. The method according to claim 1, wherein the transferring step comprises transferring the data externally on an external transfer path of a semiconductor component.

4. The method according to claim 1, wherein the transferring step comprises transferring the data from and to a semiconductor memory.

5. The method according to claim 1, which comprises providing a voltage-related bit sequence as the data sequence to be transferred.

6. The method according to claim 1, which comprises providing a clock signal and transferring the data signal synchronously with the clock signal.

7. The method according to claim 1, which comprises providing a clock signal with a rising clock edge and a falling clock edge, and transferring the data signal synchronously with one of the rising clock edge and the falling clock edge of the clock signal.

8. The method according to claim 1, which comprises additionally transferring a reference signal with a current level and a voltage level for comparing the current level of the data signal with the current level of the reference signal and for comparing the voltage level of the data signal with the voltage level of the reference signal.

9. A data transfer method, which comprises the following method steps:
   coding a data sequence by defining a current level and a voltage level for a data signal and multiplexing the current level from at least two current intensities and multiplexing the voltage level from at least two voltage levels;
   transferring the data signal; and
   decoding the data signal by evaluating the current level and the voltage level and determining therefrom the data sequence transferred in the data signal.

10. A data transfer device, comprising:
   a first multiplexer/demultiplexer for coding a data sequence containing at least two bits by defining a current level and a voltage level for a data signal;
   a transfer path for transferring the data signal connected to said first multiplexer/demultiplexer; and
   a second multiplexer/demultiplexer connected to said transfer path for receiving the data signal, said second multiplexer/demultiplexer decoding the data signal by evaluating the received current level and the received voltage level to determine the transferred data sequence containing the at least two bits.

11. The device according to claim 10, wherein said transfer path is an internal transfer path in a semiconductor component.

12. The device according to claim 10, wherein said transfer path is an external transfer path connected to a semiconductor component.

13. The device according to claim 10, wherein said transfer path is an input/output path of a semiconductor memory.

14. The device according to claim 10, wherein said transfer path is a bidirectional data transfer path.

15. The device according to claim 10, wherein a demultiplexer includes a voltage pickup, a current pickup, a voltage comparator for evaluating a voltage measured by said voltage pickup, and a current comparator for evaluating a current intensity measured by said current pickup.

16. A data transfer device, comprising:
   a first multiplexer/demultiplexer for coding a data sequence by defining a current level and a voltage level for a data signal;
   a transfer path for transferring the data signal connected to said first multiplexer/demultiplexer;
   a second multiplexer/demultiplexer connected to said transfer path for receiving the data signal, said second multiplexer/demultiplexer decoding the data signal by evaluating the received current level and the received voltage level to determine the transferred data sequence; and
   one of said first and second multiplexers has at least two separately switchable CMOS inverters with an equal driver strength, for multiplexing the current level from at least two current intensities and the voltage level from at least two voltage levels.

* * * * *